United States Patent [19]
Brown et al.

[11] Patent Number: 5,629,530
[45] Date of Patent: May 13, 1997

[54] SEMICONDUCTOR DEVICE HAVING AN ORGANIC SEMICONDUCTOR MATERIAL

[75] Inventors: Adam R. Brown; Dagobert M. De Leeuw; Erik J. Lous; Edsko E. Havinga, all of Eindhoven, Netherlands

[73] Assignee: U.S. Phillips Corporation, New York, N.Y.

[21] Appl. No.: 442,247

[22] Filed: May 15, 1995

[30] Foreign Application Priority Data

May 16, 1994 [EP] European Pat. Off. ............. 94201368

[51] Int. Cl.⁶ ..................... H01L 51/00; H01L 35/24
[52] U.S. Cl. ........................................................ 257/40
[58] Field of Search ........................ 257/40, 642, 759

[56] References Cited

U.S. PATENT DOCUMENTS 4,780,790  10/1988  Takimoto et al. ................. 361/323
5,500,537  3/1996  Tsumura et al. .................... 257/40

FOREIGN PATENT DOCUMENTS 0423956  4/1991  European Pat. Off. ........ C30B 29/54
0592333A1  4/1994  European Pat. Off. ........... H01B 1/12

*Primary Examiner*—Jerome Jackson, Jr.
*Assistant Examiner*—Nathan K. Kelley
*Attorney, Agent, or Firm*—Steven R. Biren

[57] ABSTRACT

A semiconductor device is provided with an organic material which is formed by a solid-state mixture of organic donor and organic acceptor molecules. A semiconducting solid-state mixture is known with molar ratios between donor and acceptor molecules of 1.3:2 and 1.66:2. The known solid-state mixture has the disadvantage that its electrical conductivity is comparatively high, so that it is not possible to manufacture switchable devices from the mixture. Here the material includes an n- or p-type semiconductor material, the n-type semiconductor material having a molar ratio between the donor and acceptor molecules below 0.05, and the p-type semiconductor material having this ratio above 20. These solid-state mixtures may be used for manufacturing switchable semiconductor devices. The n- and p-type organic solid-state mixtures can be used for manufacturing transistors, diodes, and field effect transistors in a same manner as, for example, doped silicon or germanium.

9 Claims, 3 Drawing Sheets

SEMICONDUCTOR DEVICE HAVING AN ORGANIC SEMICONDUCTOR MATERIAL

BACKGROUND OF THE INVENTION

The invention relates to a device provided with an organic material which is formed by a solid-state mixture of organic donor and organic acceptor molecules. "Donor molecule" is here understood to mean a molecule which can give off an electron comparatively easily, and "acceptor molecule" a molecule which can take up an electron comparatively easily.

A solid-state mixture of the kind mentioned in the opening paragraph is known from European Patent Application no. 423956. The solid-state mixture is semiconducting at molar ratios between donor and acceptor molecules of 1.3:2 and 1.66:2. The known solid-state mixture described has the disadvantage that the electrical conductivity of the known solid-state mixture is comparatively high, so that it is not possible to influence the conductivity of the solid-state mixture to the extent that switchable devices can be manufactured.

SUMMARY OF THE INVENTION

The invention has for its object inter alia to counteract this disadvantage.

According to the invention, the device is for this purpose characterized in that the material comprises an n- or p-type semiconductor material, wherein the n-type semiconductor material has a molar ratio between the donor and acceptor molecules below 0.05, and wherein the p-type semiconductor material has this ratio greater than 20. It is accordingly possible with the donor/acceptor combination to manufacture an n-type as well as a p-type organic semiconductor.

The solid-state mixtures according to the invention may be used for manufacturing switchable semiconductor devices. The n- and p-materials may be used for manufacturing transistors, diodes, and field effect transistors in the same manner as, for example, doped silicon or germanium.

The known solid-state mixtures are used for manufacturing an organic conductor. Given a molar ratio between donor and acceptor molecules of 1:1, the solid-state mixture becomes semi-metallic. At donor/acceptor ratios of 1.3:2 and 1.66:2, i.e. comparatively close to 1:1, the conductivity of the solid-state mixture is lower than in the case of purely metallic conductivity, but the conductivity is still so high that no switching elements can be made with the solid-state mixture. In addition, the known solid-state mixtures do not exhibit n- or p-type behavior, i.e. the conductivity is not determined by comparatively loosely bound electrons or holes. The solid-state mixture according to the invention, on the other hand, behaves as an n- or p-type semiconductor. This means that effects such as depletion, enhancement, injection of charge carriers, field effect, etc., known from other semiconductor materials, can be used for making switching elements. The solid-state mixture behaves as an n-type semiconductor in the case of a molar solid-state mixture ratio between donors and acceptors below 0.05, i.e. with a relatively very large number of acceptor molecules. The solid-state mixture behaves as a p-type semiconductor in the case of a molar ratio above 20, i.e. with a relatively very large number of donor molecules. In contrast to the mixture according to the invention, the presence of acceptor atoms leads to a p-type behavior in semiconductor materials such as e.g. silicon, whereas the presence of donor atoms leads to an n-type behavior.

It is suspected that the behavior of the solid-state mixture with comparatively low and high molar donor/acceptor ratios is caused by a so-called hopping mechanism. Thus n-type behavior of the solid-state mixture with a low molar donor/acceptor ratio could be caused by the fact that the conductivity is determined by electrons of donor molecules, of which there are relatively few, which move ("hop") to lattice locations (holes) on acceptor molecules, of which there are comparatively many available. The reverse could be the case for p-type material.

Preferably, the device comprises both an n-type region manufactured from the n-type material and a p-type region manufactured from the p-type material. The solid-state mixture used in a semiconductor device according to the invention may be manufactured comparatively easily through codeposition from two vapor sources, one for donor molecules and one for acceptor molecules, at a reduced pressure, for example lower than $1.3 \times 10^{-3} \text{N/m}^2$ ($10^{-5}$ torr). The molar donor/acceptor ratio may be changed comparatively easily in that the yields of the sources are adapted, for example by adapting a source temperature. Thus both n-type and p-type regions of the organic semiconductor can be made in one vapor deposition process. The semiconductor device according to the invention, accordingly, is much easier to manufacture than, for example, silicon semiconductor devices where high-temperature diffusion plays a part in manufacturing n- and p-type regions. Preferably, the device comprises a pn junction between the p- and the n-type regions. Such a pn junction behaves as a diode and is a basic form of a switching element. The pn junction can also be manufactured in a simple manner, as can the separate p- and n-type regions, through variation of the yields of vapor deposition sources of donor and acceptor molecules.

An additional advantage is obtained when the device comprises a further region manufactured from a solid-state mixture of the organic donor and organic acceptor molecules, where the molar ratio between the donor and acceptor molecules is substantially equal to one. Such a region has semi-metallic properties and may thus be used, for example, as a connection region, buried conductor, or interconnection between semiconducting regions. Semi-metallic regions can be manufactured in one process step, along with n- and p-type regions, in that the molar donor-acceptor ratio is changed to approximately 1:1 during manufacture. An additional metallization step is necessary in the manufacture of such a conductive region in the case of semiconductor materials such as silicon.

Preferably, the device comprises a region adjoining a surface and made from the n-type material provided with a passivated surface layer. It is found in practice that n-type material forms a passivating surface layer when it is exposed to air (a mixture of $N_2$ and $O_2$) after its manufacture under reduced pressure. If the semiconductor device is so manufactured that regions of n-type material adjoin a surface, then the device is passivated after vapor deposition under vacuum conditions when it is exposed to an atmosphere containing oxygen. This effect may be compared to passivation of a silicon surface through formation of silicon dioxide.

Preferably, the device comprises a field effect transistor, with a source and a drain region, and with an interposed n-type channel region manufactured from the n-type material, which channel region is provided with a gate electrode which is separated from the channel region by an insulating layer, while a side of the channel region facing away from the gate electrode is provided with a passivated surface layer which adjoins a surface. The side of the channel region facing away from the gate electrode is passivated upon exposure to air. A comparatively narrow channel region results from this. Such a narrow channel region has a favorable influence on a so-called on/off ratio of the field effect transistor, i.e. the difference in conductivity in the channel region when the channel is blocked or rendered conducting in known manner via the gate electrode.

Known donor molecules are, for example, TTF: tetrathiafulvalene, TMTTF: tetramethyltetrathiafulvalene, TSF: tetraselenafulvalene, TMTSF: tetramethyltetrasilenafulvalene. Known acceptor molecules are, for example, TCNQ: tetracyanoquinodimethane, TNAP: tetracyanonaphtoquinodimethane, and TCNDQ: tetracyanodiquinodimethane. All these molecules can be used as donor and acceptor molecules in a solid-state mixture according to the invention. For further examples of organic donor and acceptor molecules, the reader is referred to the book: "Organic Charge-Transfer Complexes" by R. Foster, Academic Press 1969, Table 1.1, pp. 5–11. Preferably, the organic donor molecule comprises TTF: tetrathiafulvalene and the organic acceptor molecule comprises TCNQ: tetracyanoquinodimethane. These materials are comparatively easily available and can be readily applied at a temperature below 200° C.

An additional advantage is obtained when a surface of the device is provided with a surface layer which seals the device off against oxygen. The stability of the solid-state mixture is increased thereby. Preferably, the surface layer comprises silicon monoxide. Silicon monoxide can be applied at a comparatively low temperature of approximately 200° C., so that the organic donor and acceptor molecules are not attacked.

BRIEF DESCRIPTION OF THE DRAWINGS

The invention will be explained in more detail below by way of example with reference to the drawings, in which.

DESCRIPTION OF THE PREFERRED EMBODIMENTS

Figure 1:
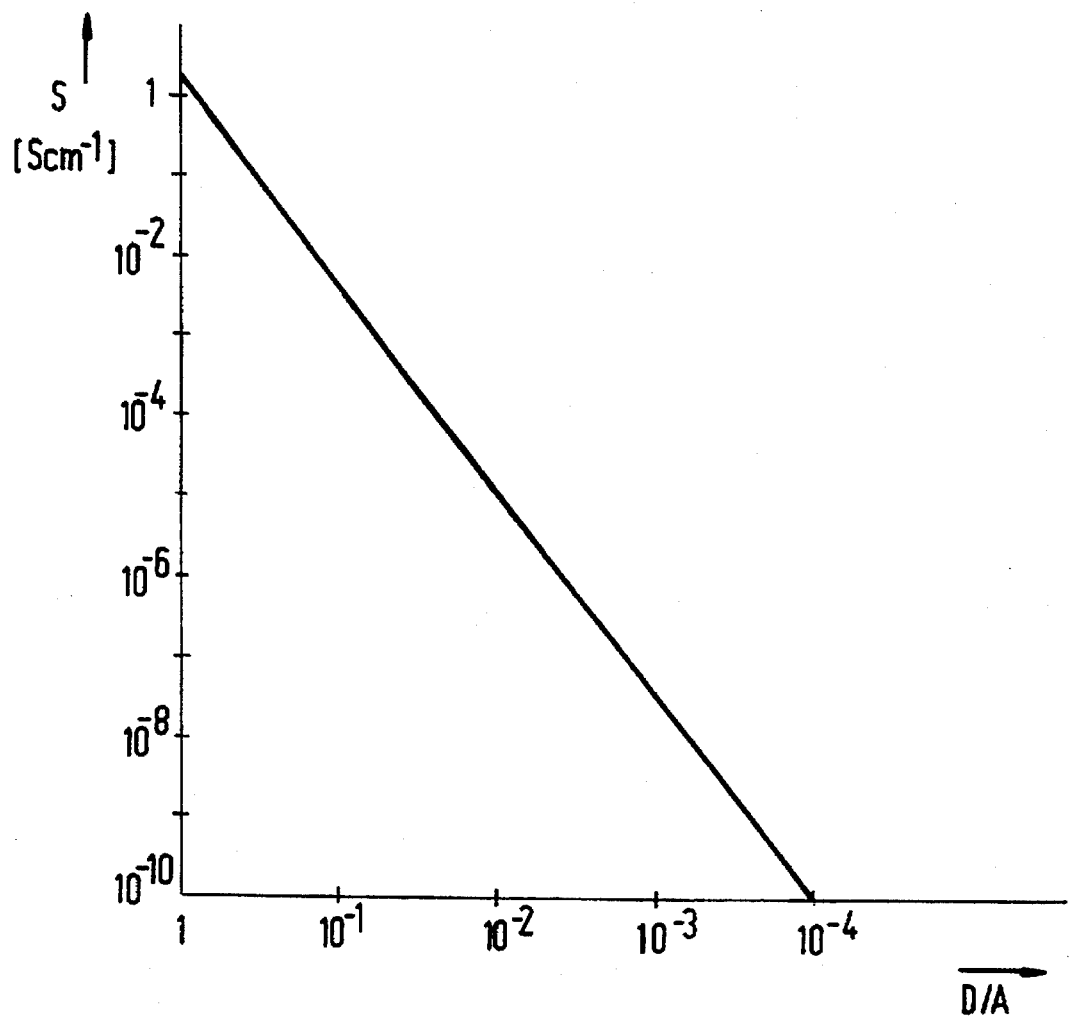
FIG. 1 shows the conductivity S as a function of the molar donor/acceptor ratio D/A of the solid-state mixture.

The Figures are purely diagrammatic and not drawn to scale. Corresponding parts have been generally given the same reference numerals in the Figures.

Figure 2:
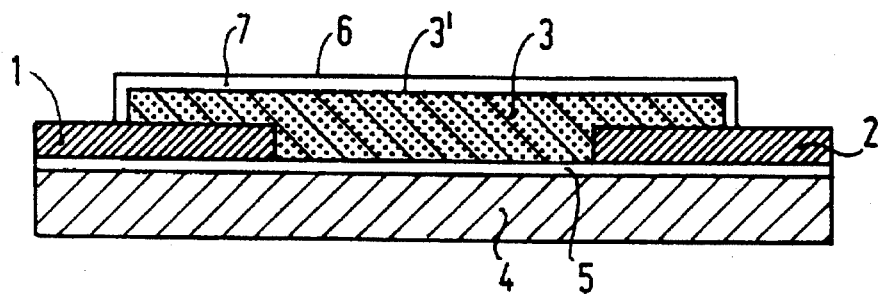
FIG. 2 shows a semiconductor device with a MOSFET transistor provided with an organic semiconductor material according to the invention.
Figure 4:
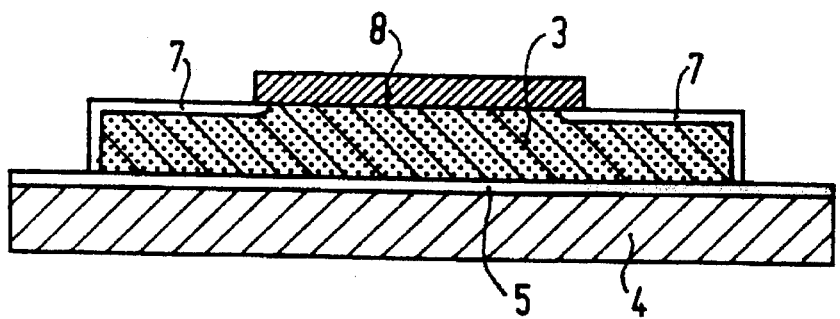
FIG. 4 shows the semiconductor device with an MIS diode provided with an organic semiconductor material according to the invention.
Figure 6:
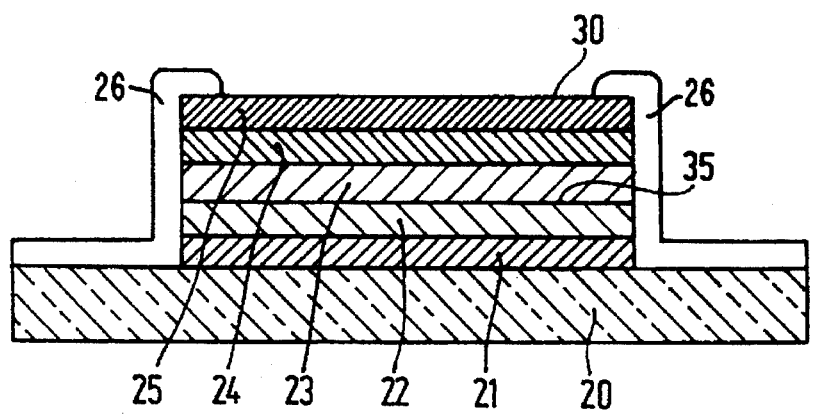
FIG. 6 shows the semiconductor device with a diode provided with a pn junction made of organic semiconductor material according to the invention.

FIGS. 2, 4 and 6 show semiconductor devices provided with an organic semiconductor material formed by a solid-state mixture of organic donor and organic acceptor molecules. A donor molecule is here understood to be a molecule which can give off an electron comparatively easily, and an acceptor molecule is understood to be a molecule which can take up an electron comparatively easily.

Known semiconducting solid-state mixtures have molar ratios between donor and acceptor molecules of 1.3:2 and 1.66:2. Such solid-state mixtures have the disadvantage that the electrical conductivity is comparatively high, so that it is not possible to manufacture switchable devices with the mixture.

According to the invention, the semiconductor material comprises an n- or p-type semiconductor material such that the n-type material has a molar ratio between the donor and acceptor molecules below 0.05, and the p-type material has this ratio above 20. The solid-state mixture behaves as an n-type semiconductor when it has a molar ratio between donors and acceptors below 0.05, so with a relative very great number of acceptor molecules. The solid-state mixture behaves as a p-type conductor at a molar ratio above 20, so with a relative very large number of donor molecules.

FIG. 1 shows how the conductivity S varies as a function of the molar donor/acceptor ratio D/A in an n-type semiconductor material manufactured from TCNQ as the acceptor molecule and TTF as the donor molecule. The electrical conductivity can accordingly be varied over many orders of magnitude in that the molar ratio between donor and acceptor molecules is controlled. FIG. 1 shows that the mixtures according to the invention have an electrical conductivity which differs very strongly from semi-metallic conductivity such as is found for known solid-state mixtures with a molar donor/acceptor ratio D/A of approximately 1.

Figure 3:
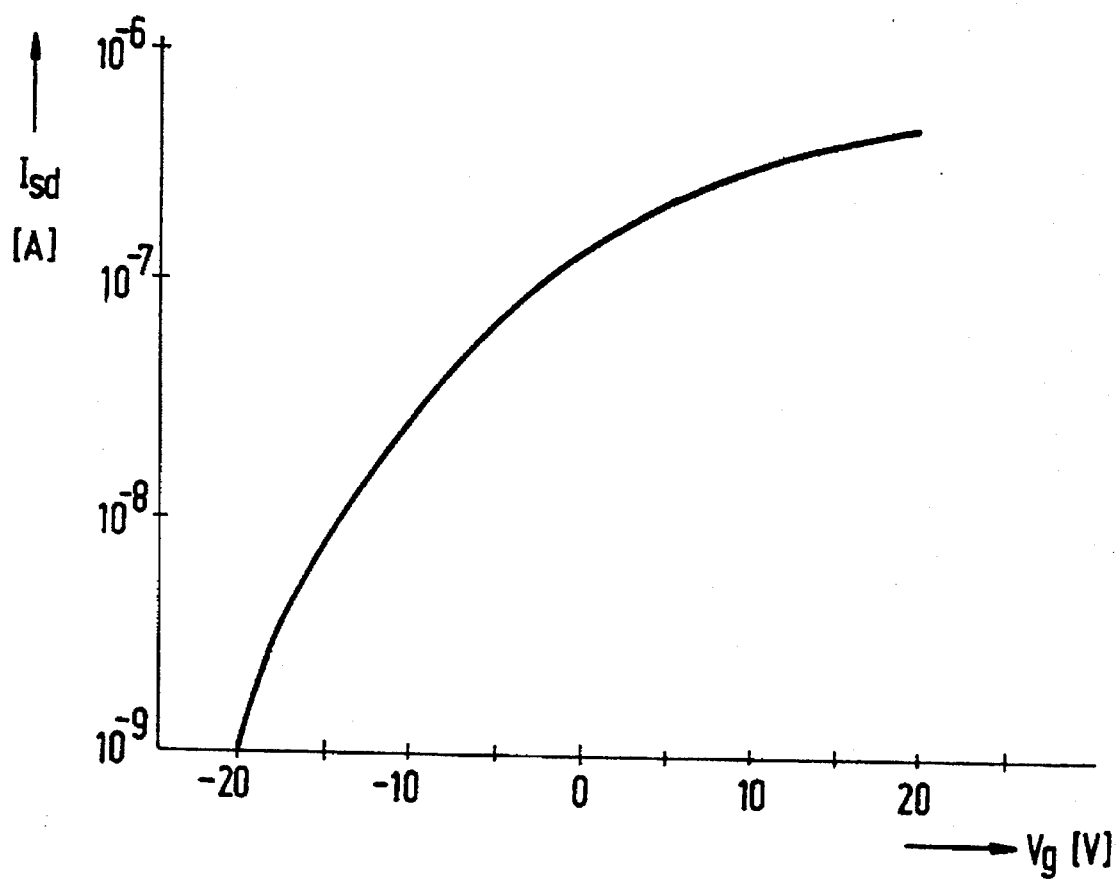
FIG. 3 shows the current $I_{sd}$ between source 1 and drain 2 of the semiconductor device of FIG. 1 as a function of the voltage $V_g$ at the gate electrode 4.

FIG. 2 shows a field effect transistor with a source region 1, a drain region 2 and an interposed n-type channel region 3 made from the n-type material, the channel region 3 being provided with a gate electrode 4 which is separated from the channel region 3 by an insulating layer 5, while a side 3' of the channel region 3 facing away from the gate electrode 4 is provided with a passivated surface layer 7 which adjoins a surface 6. Such a device is manufactured as follows. A strongly doped p-type silicon slice (approximately 0.02 $\Omega$cm) is used as the gate electrode 4. On this slice, a 50 nm thick silicon dioxide layer is grown thermally in known manner as the insulating layer 5. On this insulating layer 5 a source region 1 and drain region 2 are formed from a vapor-deposited gold layer of approximately 0.1µ thickness, which is patterned in known manner by photolithography and an etching process. The distance between the source and drain regions, the channel length L, is 5 µm, while the channel width Z, i.e. the width of the channel region 3 transverse to the plane of drawing, is 10 min. The electrical resistance between source 1/drain 2 and the gate electrode 4 is more than $10^{12}$ $\Omega$ here. Then a solid-state mixture is provided on the insulating layer 5 and on the source and drain regions 1, 2. The silicon slice is for this purpose placed in a vaporizing bell jar where a solid-state mixture of donor and acceptor molecules, TTF and TCNQ, respectively, in a molar ratio of approximately 1:200 is provided to a thickness of 0.17 µm at a pressure of $1.3 \times 10^{-4}$ N/m² ($1 \times 10^{-6}$ torr). The TCNQ and TTF are provided from different vapor sources which are kept at a temperature of approximately 150° C. The electrical conductivity of the solid-state mixture applied is $5 \times 10^{-6}$ Scm$^{-1}$. The side 3' of the channel region 3 facing away from the gate electrode 4 is passivated upon exposure of the channel region 3 to air during the removal from the bell jar. The device according to the invention then comprises a channel region 3 made of n-type semiconductor material of the solid-state mixture provided with a passivated surface layer 7. It is found in practice that n-type material 3 forms a passivating surface layer 7 of approximately 0.15 µm when it is exposed to an atmosphere containing oxygen after its manufacture in vacuum. The oxygen renders the n-type solid-state mixture more insulating. This effect is strongest at a boundary surface between n-type mixture and the atmosphere and becomes progressively less so towards the bulk of the solid-state mixture. A comparatively shallow channel region 3 is created by this passivation. Such a shallow channel region 3 favorably affects a so-called on/off ratio of the field effect transistor, i.e. there is a great difference in conductivity in the channel region 3 when the channel is blocked in known manner via the gate electrode 4 and when the channel is made conducting. The conductivity of the channel region in the conducting state does decrease owing to the passivation because the channel region 3 becomes shallower (less thick). FIG. 3 is a graph in which a current $I_{sd}$ between source 1 and drain 2 is plotted horizontally and a voltage $V_g$ applied to the gate electrode 4 is plotted horizontally. The voltage between source 1 and drain 2 was set for a fixed value of 20V here. The curve of FIG. 3 was registered 47 days after manufacture, so with a fully passivated surface. It is evident from FIG. 3 that the on/off ratio (measured for $V_g$ of +20 and −20V) is great: $3 \times 10^{-7}/10^{-9}$, i.e. approximately 300.

Figure 5:
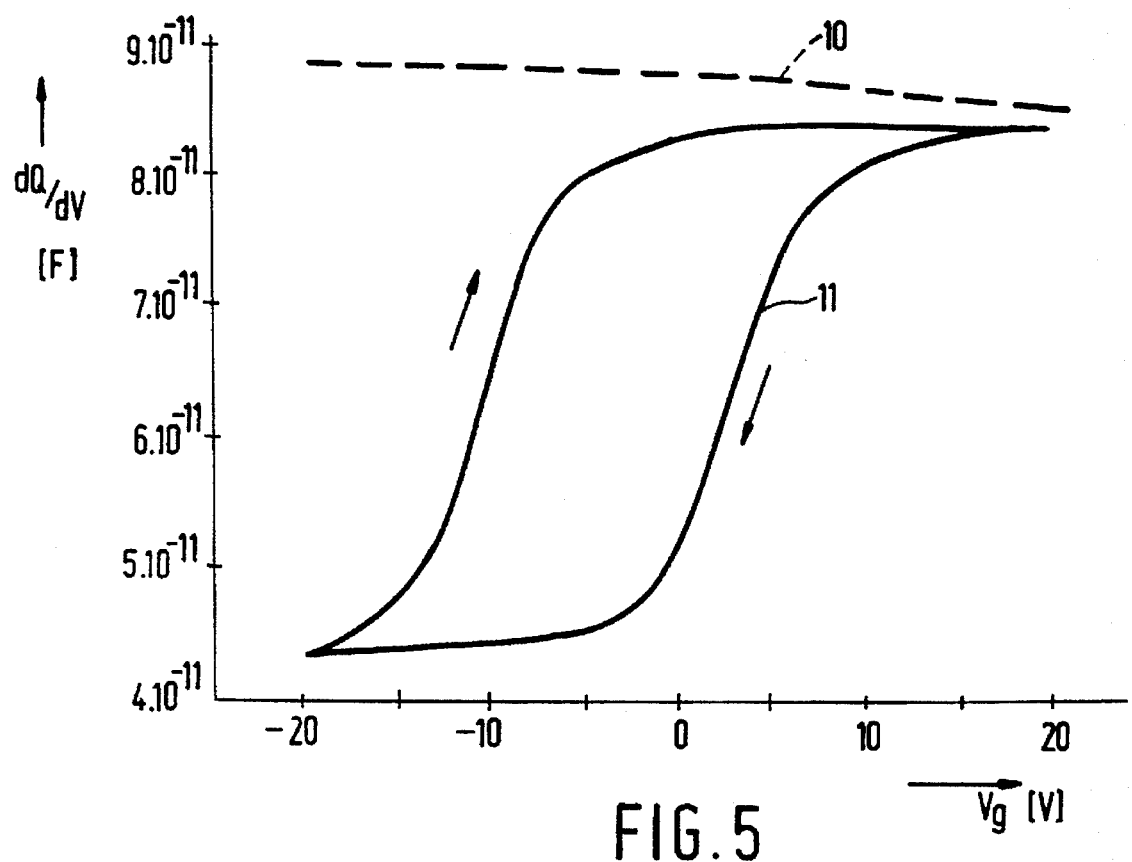
FIG. 5 shows the differential capacitance dQ/dV, Q being the charge at electrodes 4, 8 and V the voltage $V_g$ at the gate electrode 4 of the semiconductor device of FIG. 4, as a function of the voltage $V_g$ at the gate electrode 4.

FIG. 4 shows a so-called MIS (Metal Insulator Semiconductor) diode according to the invention. This MIS diode is manufactured in a manner analogous to that of the field effect transistor of the preceding example, but no source and drain regions are provided now, whereas a second gold electrode 8 is provided on the surface 6. The MIS diode has a surface area of 0.31 mm$^2$. The MIS diode behaves as a capacitance which can store charge Q at its electrodes 8 and 4. FIG. 5 shows a differential capacitance $dQ/dV_g$ as a function of the voltage $V_g$ applied to the gate electrode 4. FIG. 5 was registered at a frequency of 1 kHz and an amplitude of 0.5V, the voltage $V_g$ across the electrodes 4 and 8 being varied at a rate of 20V/minute. The broken line 10 gives the differential capacitance of the device without the semiconductor layer 3, the full line 11 the differential capacitance of the device with the semiconductor layer 3. The differential capacitance value of curve 11 approaches the value of curve 10 for $V_g$ greater than approximately 20V. This indicates that the semiconductor material 3 is enhanced with electrons, so that the semiconductor region 3 is regarded as a conductor for the differential capacitance dQ/dV and the differential capacitance is determined by the insulating layer 5, as is the case for curve 10, where the electrode 8 lies directly on the insulating layer. The differential capacitance value of curve 11 approaches that value of dQ/dV which belongs to an insulating layer comprising both the insulating layer 5 and the semiconductor region 3 when $V_g$ becomes lower than approximately −20V. This is an indication that the semiconductor region 3 is fully depleted of charge at these voltages. FIG. 5 shows clearly, therefore, that the solid-state mixture behaves as an n-type semiconductor. It is noted that the MIS diode exhibits a hysteresis in its differential capacitance curve. The cause of this hysteresis is not clear, but it could be due to various mechanisms such as charge being held at a boundary surface, oxide charge, or migration of donor or acceptor molecules.

FIG. 6 shows a device which comprises both an n-type region 23 manufactured from the n-type material and a p-type region 22 manufactured from the p-type material, a pn junction 35 being formed between the p- and n-type regions. The device also comprises a further region 24 made from a solid-state mixture of the organic donor and organic acceptor molecules in which the molar ratio between the donor and acceptor molecules is substantially equal to one. The device of FIG. 6 is a diode. Such a device is manufactured as follows. Solid-state mixtures of the donor and acceptor molecules are provided on an insulating substrate 20 made of glass. The silicon slice is for this purpose placed in a vaporizing bell jar where a solid-state mixture of TTF and TCNQ as the donor and acceptor materials, respectively, is provided from different vapor sources at a pressure of $1.3 \times 10^{-4}$N/m$^2$ ($1 \times 10^{-6}$ torr). The temperatures of the vapor sources are set in dependence on the desired ratio between donor and acceptor molecules. Different layers 21 to 24 are provided in one process sequence, i.e. without the substrate 20 being taken from the bell jar. First a semi-metallically conducting layer 21 comprising a solid-state mixture with a molar ratio TTF/TCNQ of approximately 1:1 is provided to a thickness of 0.2 μm. This layer 21 acts as a first electrode of the semiconductor device. The electrical conductivity of the solid-state mixture provided is approximately 1 Scm$^{-1}$. Then a p-type semiconductor layer 22 of 0.2 μm thickness is provided, comprising a solid-state mixture with a molar ratio TTF/TCNQ of approximately 200: 1, without the substrate 20 being removed from the bell jar. The electrical conductivity of the solid-state mixture provided is $5 \times 10^{-6}$ Scm$^{-1}$. On the p-type layer 22, an n-type semiconductor layer 23 is provided, comprising a solid-state mixture with a molar ratio TTF/TCNQ of approximately 1:200. The electrical conductivity of the solid-state mixture provided is $5 \times 10^{-6}$ Scm$^{-1}$. On the n-type layer 23, a semi-metallic layer 24 is provided, comprising a solid-state mixture of the organic donor and the organic acceptor molecules, the molar ratio between the donor and acceptor molecules being substantially equal to one here. A gold layer 25 of 0.2 μm thickness is provided on this semi-metallic layer 24 as a second electrode. The gold layer is shaped in known manner by vapor deposition, a photolithographical process, and etching. The organic layers 21 to 24 are then patterned by plasma etching. Subsequently, according to the invention, the surface 30 and the lateral sides of the device created by plasma etching are provided with a surface layer 26 which seals the device off against oxygen.

Such a layer is manufactured at a comparatively low temperature (200° C. or lower) in a low-temperature CVD (Chemical Vapor Deposition) process. The layer seals the solid-state mixture off against oxygen, whereby the stability of the solid-state mixture increases. Preferably, the surface layer 26 comprises silicon monoxide. Silicon monoxide can be provided in a known manner at a comparatively low temperature of approximately 200° C. The silicon monoxide layer ensures that the organic donor and acceptor molecules are not attacked.

Known donor molecules are, for example, TTF: tetrathiafulvalene, TMTFF: tetramethyltetrathiafulvalene, TSF: tetraselenafulvalene, TMTSF: tetramethyltetrase. lenafulvalene. Known acceptor molecules are, for example, TCNQ: tetracyanoquinodimethane, TNAP: tetracyanonaphtoquinodimethane, and TCNDQ: tetracyanodiquinodimethane. All these molecules can be used as donor and acceptor molecules in a solid-state mixture according to the invention. The mention of the above donor and acceptor material is not to be regarded as limitative. Further examples of organic donor and acceptor molecules can be found in the book: "Organic Charge-Transfer Complexes" by R. Foster, Academic Press 1969, Table 1.1, pp. 5–11. A device according to the invention is also possible with donor and acceptor molecules other than those mentioned, for example, with the said donor or acceptor molecules which have in addition been provided with groups such as long carbon chains or benzene rings (macromolecules). Preferably, the organic donor molecule comprises TTF: tetrathiafulvalene, and the organic acceptor molecule TCNQ: tetraeyanoquinodimethane. These materials are comparatively easily available and can be readily applied at a temperature below 200° C.

The invention is not limited to the embodiments described above. The semiconductor device may comprise, instead of one switching element, many switching elements on a common substrate. The semiconductor device may also comprise other switching elements such as, for example, bipolar transistors, diodes, field effect transistors, or thyristors. These devices are designed on the analogy of semiconductor devices known from silicon technology. The semiconductor devices may be made in that the solid-state mixture is patterned by known techniques such as photolithography and etching, for example, plasma etching. Conductive, p-type and n-type regions can be manufactured and shaped then by means of the solid-state mixture according to the invention.

We claim:

1. A semiconductor device provided with an organic material which is formed by a solid-state mixture of organic donor and organic acceptor molecules, characterized in that the material comprises an n- or p-type semiconductor material, wherein the n-type semiconductor material has a molar ratio between the donor and acceptor molecules below 0.05, and wherein the p-type semiconductor material has this ratio greater than 20.

2. A semiconductor device as claimed in claim 1, characterized in that the device comprises both an n-type region manufactured from the n-type material and a p-type region manufactured from the p-type material.

3. A semiconductor device as claimed in claim 2, characterized in that the device comprises a pn junction between the p- and the n-type regions.

4. A semiconductor device as claimed in claim 1, characterized in that the device comprises a further region manufactured from a solid-state mixture of the organic donor and organic acceptor molecules where the molar ratio between the donor and acceptor molecules is substantially equal to one.

5. A semiconductor device as claimed in claim 1, characterized in that the device comprises a region adjoining a surface and made from the n-type material provided with a passivated surface layer.

6. A semiconductor device as claimed in claim 1, characterized in that the device comprises a field effect transistor, with a source and a drain region, and with an interposed n-type channel region manufactured from the n-type material, which channel region is provided with a gate electrode which is separated from the channel region by an insulating layer, while a side of the channel region facing away from the gate electrode is provided with a passivated surface layer which adjoins a surface.

7. A semiconductor device as claimed in claim 1, characterized in that the organic donor molecule comprises TTF: tetrathiafulvalene and the organic acceptor molecule comprises TCNQ: tetracyanoquinodimethane.

8. A semiconductor device as claimed in claim 1, characterized in that a surface of the device is provided with a surface layer which seals the device off against oxygen.

9. A semiconductor device as claimed in claim 8, characterized in that the surface layer comprises silicon monoxide.

* * * * *